(12) United States Patent
Okuno et al.

(10) Patent No.: US 8,258,052 B2
(45) Date of Patent: Sep. 4, 2012

(54) METHOD OF MANUFACTURING SILICON CARBIDE SEMICONDUCTOR DEVICE

(75) Inventors: Koji Okuno, Tokyo (JP); Yoichiro Tarui, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 57 days.

(21) Appl. No.: 12/899,061

(22) Filed: Oct. 6, 2010

(65) Prior Publication Data
US 2011/0195563 A1  Aug. 11, 2011

(30) Foreign Application Priority Data

Feb. 9, 2010 (JP) ................................. 2010-026406

(51) Int. Cl.
*H01L 21/425* (2006.01)
(52) U.S. Cl. ........ 438/514; 438/519; 438/527; 438/531; 438/942; 438/945; 257/E21.035; 257/E21.058
(58) Field of Classification Search .................. 438/514, 438/519, 527, 531, 942, 945, FOR. 459; 257/E21.035, E21.058
See application file for complete search history.

(56) References Cited

U.S. PATENT DOCUMENTS

| 6,727,128 | B2 * | 4/2004 | Sridevan | 438/197 |
| 6,927,153 | B2 * | 8/2005 | Raisanen et al. | 438/549 |
| 7,381,992 | B2 * | 6/2008 | Ryu | 257/77 |
| 7,495,347 | B2 | 2/2009 | Raisanen et al. | |
| 7,855,415 | B2 * | 12/2010 | Challa et al. | 257/341 |
| 2003/0153118 | A1 | 8/2003 | Sridevan | |
| 2009/0098718 | A1 | 4/2009 | Knaipp et al. | |

FOREIGN PATENT DOCUMENTS

| EP | 0 912 999 B1 | 5/1999 |
| JP | 8-306937 | 11/1996 |
| JP | 10-321879 | 12/1998 |
| JP | 11-121394 | 4/1999 |
| JP | 2004-260180 | 9/2004 |
| JP | 2005-294584 | 10/2005 |
| JP | 2008-522420 | 6/2008 |

OTHER PUBLICATIONS

U.S. Appl. No. 13/164,430, filed Jun. 20, 2011, Tarui.
Office Action issued Feb. 20, 2012 in German Application No. 10 2011 003 660.1 (With English Translation).
Reason(s) for Refusal issued Jan. 16, 2012 in Korean Patent Application No. 10-2011-0003795 (with Partial English translation).

* cited by examiner

*Primary Examiner* — Michelle Mandala
(74) *Attorney, Agent, or Firm* — Oblon, Spivak, McClelland, Maier & Neustadt, L.L.P.

(57) ABSTRACT

A method of manufacturing a silicon carbide semiconductor device according to the present invention includes the steps of (a) forming an implantation mask made up of a plurality of unit masks on a silicon carbide semiconductor layer, and (b) implanting predetermined ion in the silicon carbide semiconductor layer at a predetermined implantation energy by using the implantation mask. In the step (a), the implantation mask is formed such that a length from any point in the unit mask to an end of the unit mask can be equal to or less than a scattering length obtained when the predetermined ion is implanted in silicon carbide at the predetermined implantation energy and the implantation mask can have a plurality of regions different from each other in terms of a size and an arrangement interval of the unit masks.

12 Claims, 11 Drawing Sheets

F I G. 2A
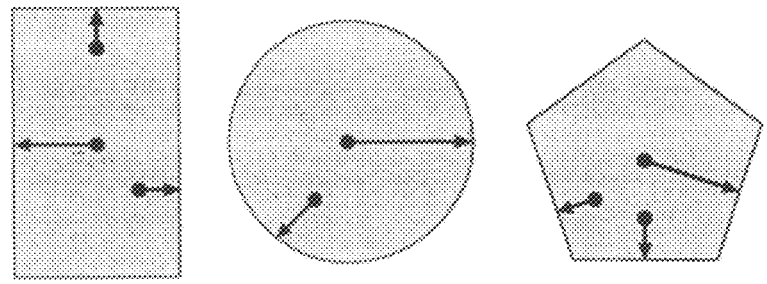
SHORTEST LENGTH TO MASK END ⟶ IS EQUAL TO OR LESS THAN 250 nm
F I G. 2B
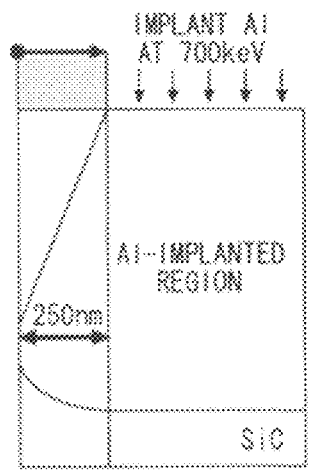
F I G. 2C
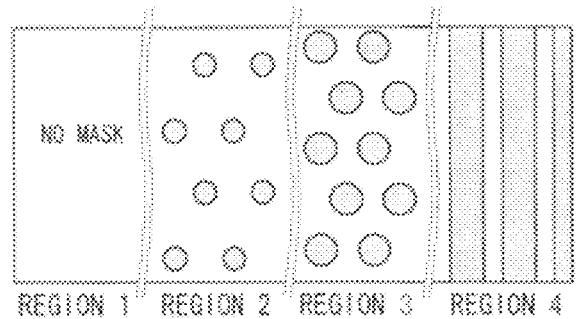

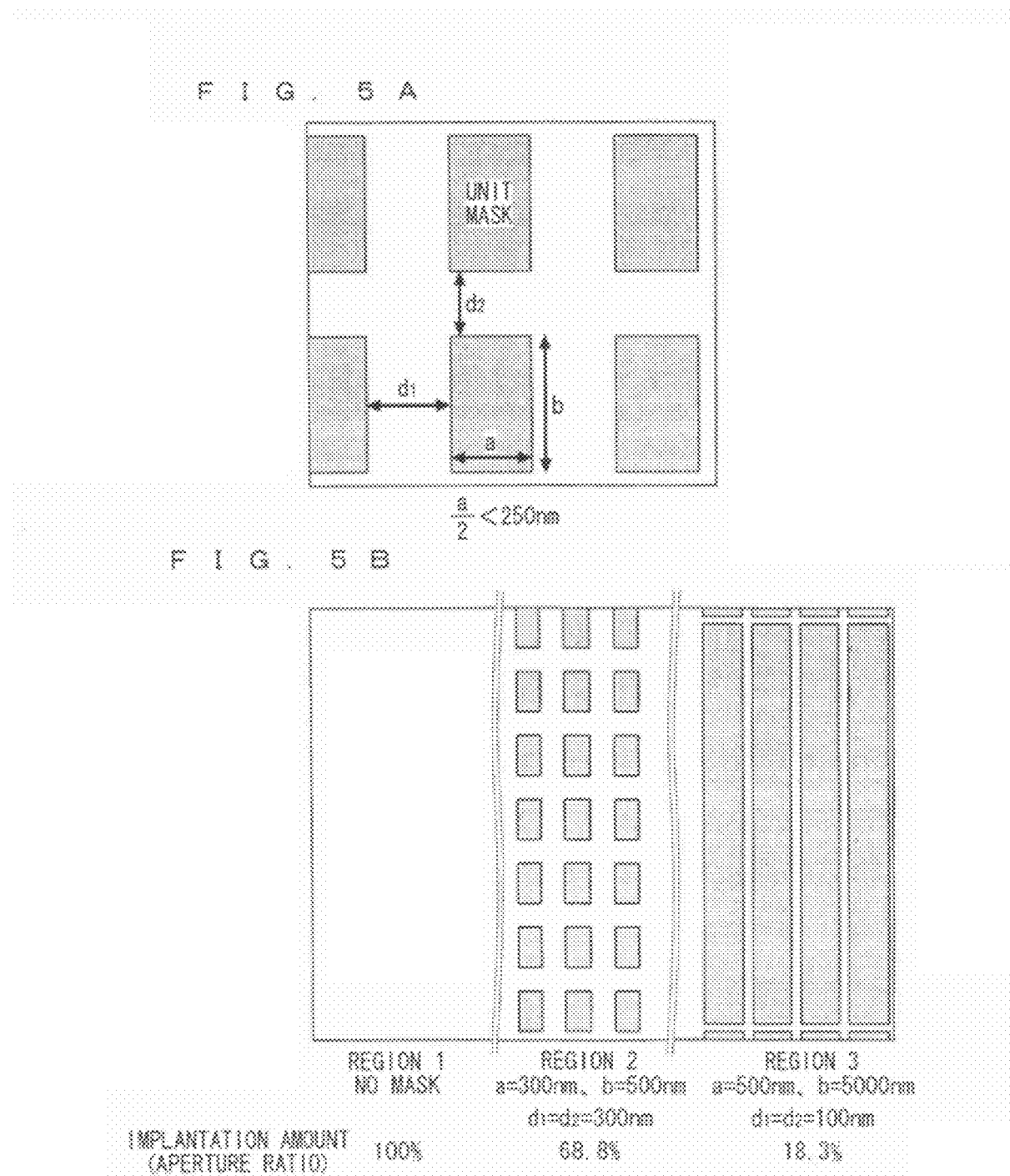

F I G . 8
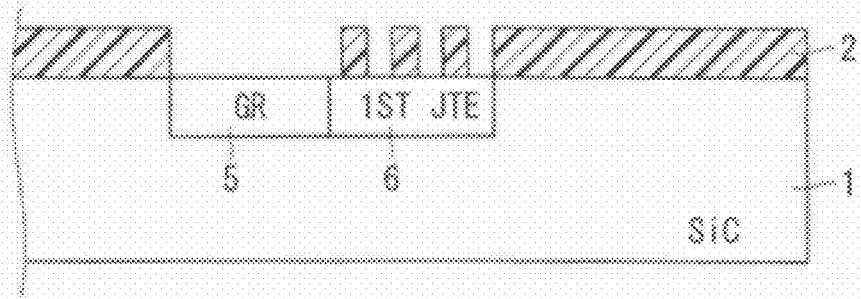
F I G . 9
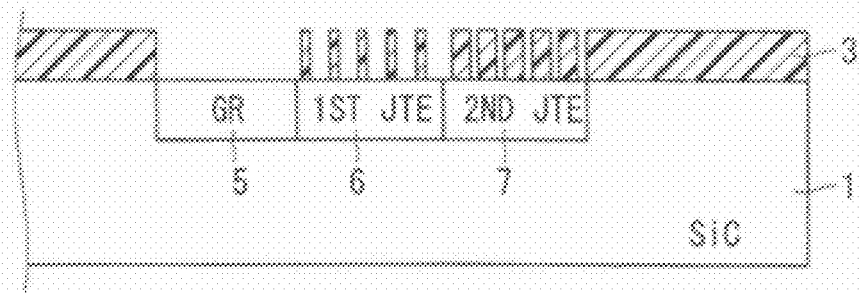
F I G . 1 0
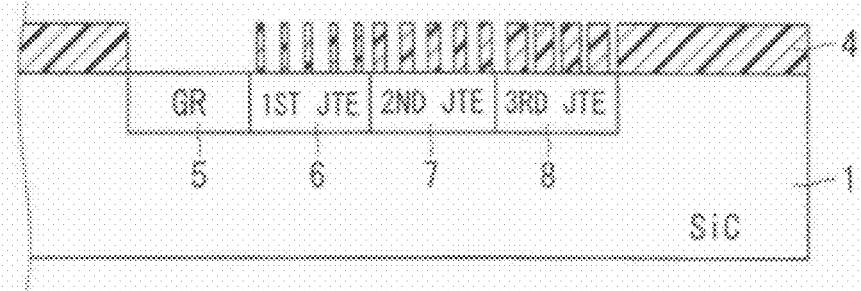

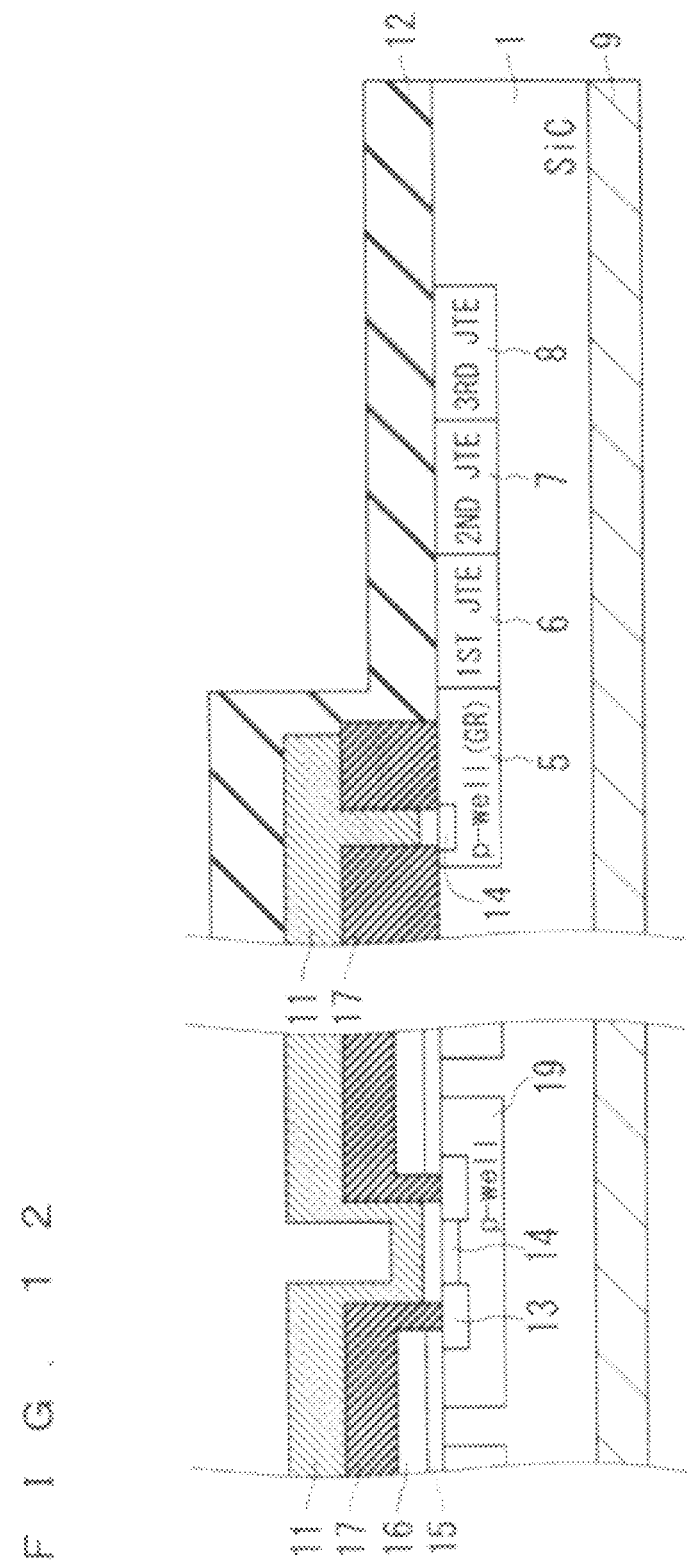

METHOD OF MANUFACTURING SILICON CARBIDE SEMICONDUCTOR DEVICE

BACKGROUND OF THE INVENTION

1. Field of the Invention

The present invention relates to a method of manufacturing a silicon carbide semiconductor device having a plurality of regions with different impurity concentrations.

2. Description of the Background Art

An important problem in manufacturing a silicon carbide semiconductor device is to reduce a work period and a cost by reducing the number of process steps.

Generally, in a power semiconductor device, power of a relatively high voltage is handled, and therefore a breakdown voltage structure using the RESURF principle is often employed, as in a high breakdown voltage semiconductor device disclosed in Japanese Patent Application Laid-Open No. 8-306937 (1996), for example. In the RESURF structure, a p region and a p-well region formed around the p region and having a relatively low impurity concentration are provided, to thereby relieve an electric field at a terminal portion of a pn junction.

However, when this structure is employed, two p-type regions having different impurity concentrations need to be formed. For forming a plurality of regions having different impurity concentrations, a flow including the steps of (1) forming a mask that protects a region where no impurity is to be implanted, (2) implanting an impurity into an opening portion of the mask, and (3) removing the mask, is performed for each of the regions. Therefore, as the number of regions having different impurity implantation amounts increases, a work period and costs increase. Moreover, there is a problem that, in a case of an Al-ion implantation which requires high energy, a beam current is low and a ion-implantation time period is prolonged.

Accordingly, as a method of forming a plurality of regions having different impurity implantation amounts in a single mask step, for example, Japanese Patent Application Laid-Open No. 2004-260180 and Japanese Patent Application Laid-Open No. 11-121394 (1999) disclose a technique of forming a mask by arranging, at predetermined intervals, a plurality of unit masks each designed under consideration of a thermal diffusion length of implanted ion being diffused by a heat treatment.

Since a diffusion coefficient in silicon carbide is very small, an impurity which is ion-implanted into silicon carbide is not diffused by a heat treatment. Thus, it is impossible to form an impurity region by using the method disclosed in Japanese Patent Application Laid-Open No. 2004-260180 and Japanese Patent Application Laid-Open No. 11-121394 (1999). If impurity-implanted regions are formed in a silicon carbide semiconductor layer by performing an ion implantation into two opening portions which are separated from each other by a sufficiently large mask, two impurity regions are formed and these regions are not connected to each other due to diffusion even if a heat treatment is performed.

SUMMARY OF THE INVENTION

An object of the present invention is to provide a method of manufacturing a silicon carbide semiconductor device capable of forming a plurality of impurity regions having different impurity concentrations in a single mask step.

A method of manufacturing a silicon carbide semiconductor device according to the present invention includes the steps of (a) forming an implantation mask made up of a plurality of unit masks on a silicon carbide semiconductor layer, and (b) implanting predetermined ion in the silicon carbide semiconductor layer at a predetermined implantation energy by using the implantation mask. In the step (a), the implantation mask is formed such that a length from any point in the unit mask to an end of the unit mask can be equal to or less than a scattering length obtained when the predetermined ion is implanted in silicon carbide at the predetermined implantation energy and the implantation mask can have a plurality of regions different from each other in terms of a size and an arrangement interval of the unit masks.

When the implantation mask made up of the plurality of unit masks is formed on the silicon carbide semiconductor layer, the implantation mask is formed such that the length from any point in the unit mask to the end of the unit mask can be equal to or less than the scattering length obtained when the predetermined ion is implanted in silicon carbide at the predetermined implantation energy and the implantation mask can have the plurality of regions different from each other in terms of the size and the arrangement interval of the unit masks. Thereby, in the silicon carbide semiconductor layer causing substantially no thermal diffusion, a plurality of regions having different impurity concentrations can be formed in a single mask step and a single ion implantation step.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A, 2B, and 2C are diagrams for explaining an outline of the present invention;

FIGS. 5A and 5B are diagrams illustrating a state where the implantation amount is controlled by using rectangular unit masks;

FIG. 8 is a diagram for explaining a formation of a JTE structure;

FIG. 9 is a diagram for explaining a formation of a JTE structure;

FIG. 10 is a diagram for explaining a formation of a JTE structure;

FIG. 12 is a cross-sectional view showing a structure of a MOSFET; and

DESCRIPTION OF THE PREFERRED EMBODIMENTS

Preferred Embodiment 1

Figure 1:
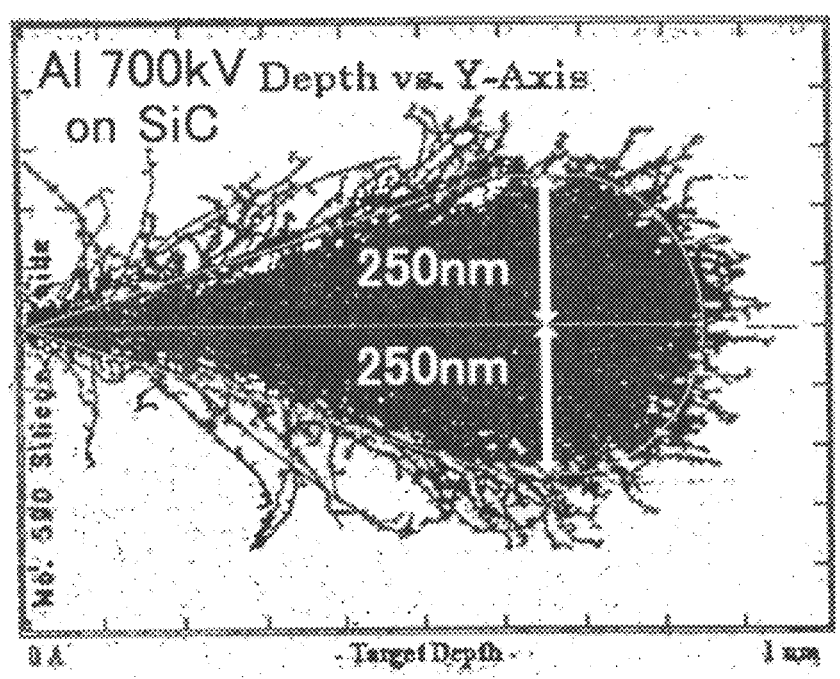
FIG. 1 shows a state of scattering obtained when Al ion is implanted into SiC.

FIG. 1 shows a result of a simulation in which Al ion was implanted into silicon carbide at 700 keV. From FIG. 1, it can be found that the Al ion implanted into the silicon carbide was scattered by about 250 nm in a direction perpendicular to a depth direction. Therefore, when Al ion is implanted at 700 keV or more, the Al ion is scattered by about 250 nm or more in the direction perpendicular to the depth direction.

FIG. 2A shows unit masks used in a method of manufacturing a silicon carbide semiconductor device of this preferred embodiment. Each of the unit masks is designed such that a length from any point in the unit mask to an end of the unit mask can be 250 nm or less. As a shape of the unit mask, various shapes, exemplified by a rectangular shape, a circular shape, and a pentagonal shape, may be adopted.

When, by using such a unit mask, Al ion is implanted into a silicon carbide semiconductor layer at 700 keV or more at least once, Al spreads also to a region immediately below the unit mask as shown in FIG. 2B so that an Al-implanted region (impurity region) is formed, because the Al ion in the silicon carbide is scattered by about 250 nm or more in a direction perpendicular to an implantation direction (FIG. 1). If such unit masks are formed in a silicon carbide semiconductor at predetermined intervals and Al is implanted through opening portions, a plurality of Al-implanted regions separated by the unit masks are connected to one another, thus forming continuous p-type regions through a plane.

In this preferred embodiment, Al is implanted into a silicon carbide semiconductor layer by using an implantation mask in which a plurality of unit masks shown in FIG. 2A are formed at arbitrary intervals. The implantation mask has a plurality of regions different from each other in the size and interval of the unit masks. In FIG. 2C, for example, a region (first region) in which no mask is formed, a region (second region) in which circular unit masks are formed at predetermined intervals, a region (third region) in which circular unit masks larger than those in the second region are formed at intervals different from those in the second region, and a region (fourth region) in which stripe-shaped unit masks are formed at predetermined intervals, are formed on a silicon carbide semiconductor. If Al ion is implanted at an implantation energy of 700 keV or more at least once after the above-described implantation mask is formed, regions having different implantation amounts can be formed in a signal mask step and a single implantation step while the amount of implanted Al is controlled by an aperture ratio of the mask. Particularly, the fact that the number of times high-energy Al ion is implanted can be reduced is very advantageous in terms of costs.

The method of manufacturing the silicon carbide semiconductor device of this preferred embodiment includes the steps of (a) forming an implantation mask made up of a plurality of unit masks on a silicon carbide semiconductor layer and (b) implanting Al ion at 700 keV or more on the silicon carbide semiconductor layer by using the implantation mask. In the step (a), the implantation mask is formed such that a length from any point in the unit mask to an end of the unit mask can be set at 250 nm or less and the implantation mask can have a plurality of regions different from each other in terms of the size and the arrangement interval of the unit masks. Thereby, impurity regions continuous with each other can be formed. By making the arrangement intervals of the unit masks different among the regions, a plurality of regions having different impurity concentrations can be formed in a single mask step and a single implantation step.

Figure 3A:
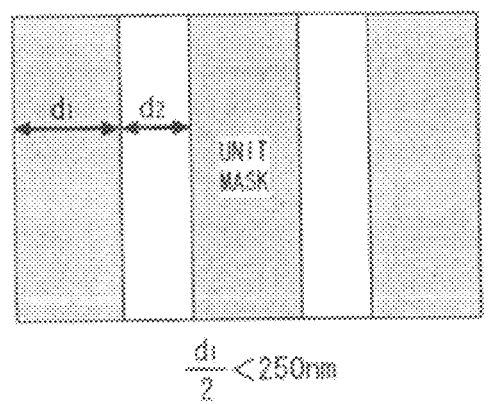
FIGS. 3A and 3B are diagrams illustrating a state where the implantation amount is controlled by using stripe-shaped unit masks.

FIG. 3A shows an example of forming the implantation mask with stripe-shaped unit masks. A stripe width is defined as $d_1$, and a mask interval is defined as $d_2$. An aperture ratio of the implantation mask is as follows.

[Math. 1]

$$\frac{d_2}{d_1 + d_2} \times 100 \, (\%) \tag{1}$$

In order that Al-implanted regions (p-type regions) can be formed throughout a plane, the stripe width $d_1$ is set so as to satisfy $d_1/2 \leq 250$ nm. The ion implantation amount can be controlled by adjusting the aperture ratio of the mask by making the values $d_1$ and $d_2$ different among the regions. Thus, an impurity concentration of a p-type region can be set at any value.

Figure 3B:
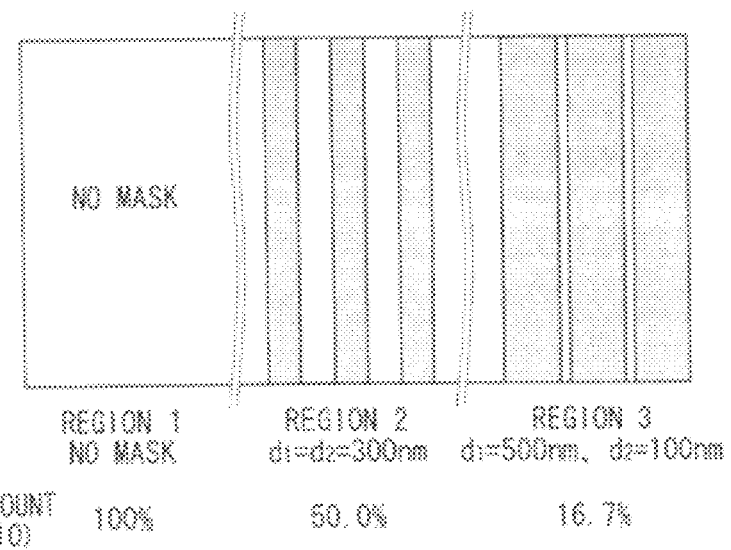

For example, as shown in FIG. 3B, no mask is formed in a region 1, the values $d_1$ and $d_2$ in a region 2 are set at $d_1=300$ nm and $d_2=300$ nm, and the values $d_1$ and $d_2$ in a region 3 are set at $d_1=500$ nm and $d_2=100$ nm. In this case, the aperture ratio in the region 1 is 100% and the aperture ratios in the regions 2 and 3 are 50% and 16.7%, respectively, based on the formula (1). When Al ion is implanted at an implantation energy of 700 keV or more by using such a mask, an Al concentration in the region 2 is 50% and an Al concentration in the region 3 is 16.7% if an Al concentration in the region 1 is defined as 100%. In this manner, the regions having different impurity concentrations can be formed in the single mask step and the single ion implantation step.

Figure 4A:
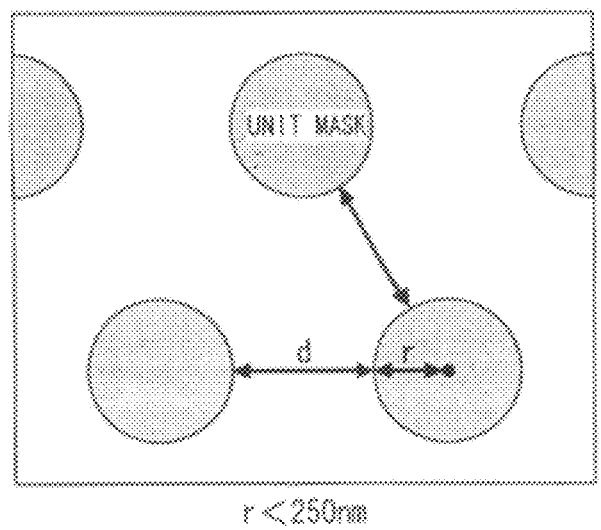
FIGS. 4A and 4B are diagrams illustrating a state where the implantation amount is controlled by using circular unit masks.

FIG. 4A shows an example of forming the implantation mask with circular unit masks. When a radius is defined as r and a mask interval is defined as d, the aperture ratio of the implantation mask is as follows.

[Math. 2]

$$\left(1 - \frac{\pi r^2}{\frac{\sqrt{3}}{2}(d + 2r)^2}\right) \times 100 \, (\%) \tag{2}$$

In order that the Al-implanted regions (p-type regions) can be formed throughout a plane, the value r is set so as to satisfy $r \leq 250$ nm. The ion implantation amount can be controlled by adjusting the aperture ratio of the mask by making the values r and d different among the regions. Thus, an impurity concentration of the p-type region can be set at any value.

Figure 4B:
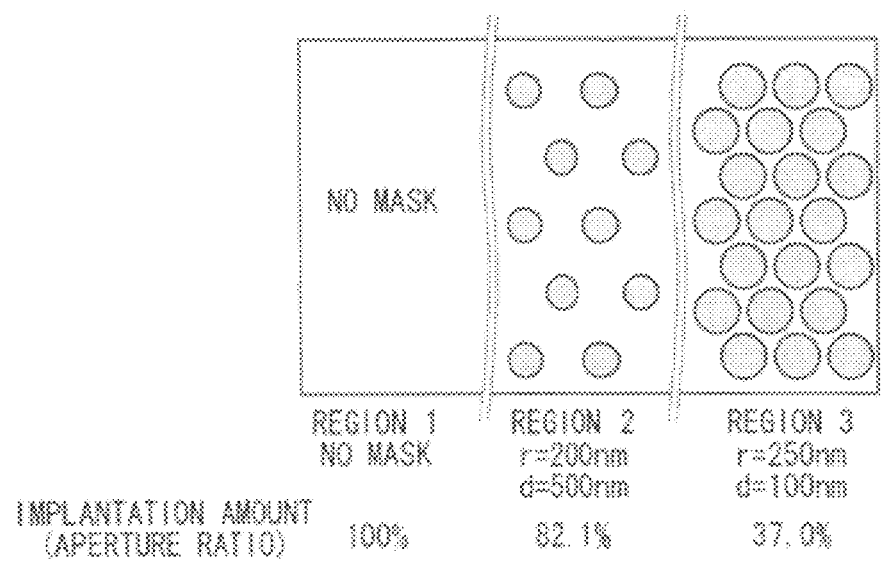

For example, as shown in FIG. 4B, no mask is formed in a region 1, the values r and d in a region 2 are set at r=200 nm and d=500 nm, and the values r and d in a region 3 are set at r=250 nm and d=100 nm. In this case, the aperture ratio in the region 1 is 100% and the aperture ratios in the regions 2 and 3 are 82.1% and 37%, respectively, based on the formula (2).

FIG. 5A shows an example of forming the implantation mask with rectangular unit masks. When the short side of the rectangular shape is defined as a, the long side of the rectangular shape is defined as b, an arrangement interval with respect to a short-side direction is defined as $d_1$, and an arrangement interval with respect to a long-side direction is defined as $d_2$, the aperture ratio of the implantation mask is as follows.

[Math. 3]

$$\frac{ad_2 + bd_1 + d_1 d_2}{(a+d_1)(b+d_2)} \times 100\,(\%) \quad (3)$$

In order that the p-type regions can be formed throughout a plane, the value a is set so as to satisfy a/2≦250 nm. The ion implantation amount can be controlled by adjusting the aperture ratio of the mask by making the values a, b, $d_1$, and $d_2$ different among the regions. Thus, an impurity concentration of the p-type region can be set at any value.

For example, as shown in FIG. 5B, no mask is formed in a region 1, the values a, b, $d_1$, and $d_2$ in a region 2 are set at a=300 nm, b=500 nm, and $d_1=d_2=300$ nm, and the values a, b, $d_1$, and $d_2$ in a region 3 are set at a=500 nm, b=5000 nm, $d_1=100$ nm, and $d_2=100$ nm. In this case, the aperture ratio in the region 1 is 100% and the aperture ratios in the regions 2 and 3 are 68.8% and 18.3%, respectively, based on the formula (3).

Figure 6A:
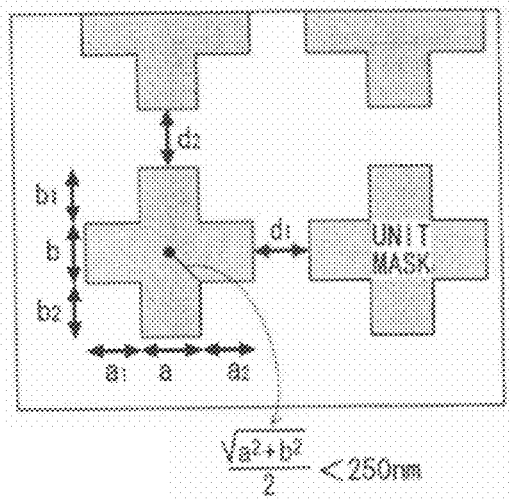
FIGS. 6A and 6B are diagrams illustrating a state where the implantation amount is controlled by using crisscross unit masks.

FIG. 6A shows an example of forming the implantation mask with crisscross unit masks. As shown in FIG. 6A, the sides included in the crisscross shape are defined as a, $a_1$, $a_2$, b, $b_1$, and $b_2$. An arrangement interval with respect to a direction parallel to the side a is defined as $d_1$, and an arrangement interval with respect to a direction parallel to the side b is defined as $d_2$. The aperture ratio of the implantation mask is as follows.

[Math. 4]

$$\frac{(a_1+a_2+d_1)(b_1+b_2+d_2) + ad_2 + bd_1}{(a+a_1+a_2+d_1)(b+b_1+b_2+d_2)} \times 100\,(\%) \quad (4)$$

In order that the p-type regions can be formed throughout a plane, the following is to be satisfied.

[Math. 5]

$$\frac{\sqrt{a^2+b^2}}{2} \leq 250\,(\text{nm}) \quad (5)$$

The ion implantation amount can be controlled by adjusting the aperture ratio of the mask by making the values a, $a_1$, $a_2$, b, $b_1$, $b_2$, $d_1$, and $d_2$ different among the regions. Thus, an impurity concentration of the p-type region can be set at any value.

Figure 6B:
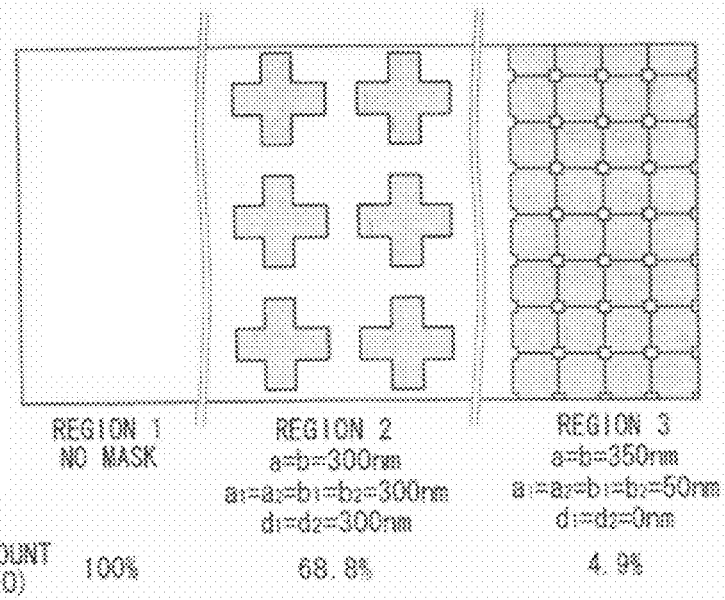

For example, as shown in FIG. 6B, no mask is formed in a region 1, the values a, $a_1$, $a_2$, b, $b_1$, $b_2$, $d_1$, and $d_2$ in a region 2 are set so as to satisfy $a=a_1=a_2=b=b_1=b_2=d_1=d_2=300$ nm, and the values a, $a_1$, $a_2$, b, $b_1$, $b_2$, $d_1$, and $d_2$ in a region 3 are set so as to satisfy a=b=350 nm, $a_1=a_2=b_1=b_2=50$ nm, and $d_1=d_2=0$ nm. In this case, the aperture ratio in the region 1 is 100% and the aperture ratios in the regions 2 and 3 are 68.8% and 4.9%, respectively, based on the formula (4).

In the above, a method of forming p-type regions having different concentrations by the three regions 1 to 3, have been described with reference to FIGS. 3 to 6. However, the number of regions is not particularly limited. In a case where two regions or four or more regions are formed, the manufacturing method of this preferred embodiment is also applicable.

Figure 7:
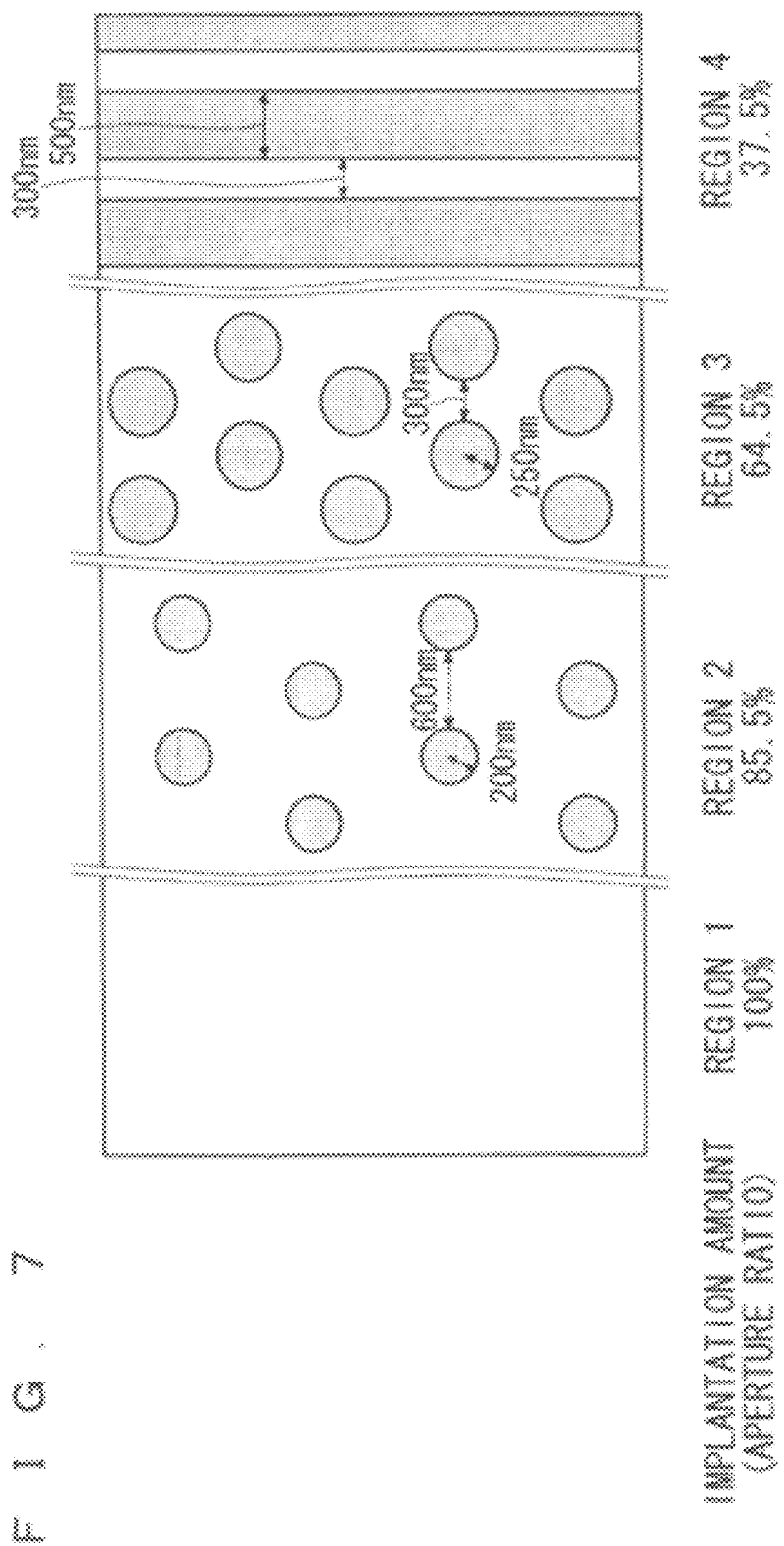
FIG. 7 is a diagram illustrating a state where the implantation amount is controlled by using a combination of unit masks having various shapes.

Although in the examples shown in FIGS. 3 to 6, three p-type regions are formed by a combination of unit masks having the same shape, unit masks having different shapes may be used for respective regions. For example, as shown in FIG. 7, no mask is formed in a region 1, circular unit masks with r=200 nm and d=600 nm are formed in a region 2, circular unit masks with r=250 nm and d=300 nm are formed in a region 3, and stripe-shaped unit masks with $d_1=500$ nm and $d_2=300$ nm are formed in a region 4. In this case, the ion implantation amount in the region 1 is 100%, the ion implantation amounts in the regions 2 and 3 are 85.5% and 64.5%, respectively, based on the formula (2), and the ion implantation amount in the region 4 is 37.5% based on the formula (1).

JTE (Junction Termination Extension) structures shown in FIGS. 8 to 10 can be formed by using the implantation mask of this preferred embodiment. To form a single JTE region as shown in FIG. 8, an ion implantation is performed using the implantation mask formed such that a GR (Guard Ring) region 5 has no mask (aperture ratio 100%) and a first JTE 6 has an aperture ratio of 50%. Alternatively, to form two JTE regions as shown in FIG. 9, an ion implantation is performed using the implantation mask formed such that a GR region 5 has no mask, a first JTE 6 has an aperture ratio of 66%, and a second JTE 7 has an aperture ratio of 33%. Alternatively, to form three JTE regions as shown in FIG. 10, an ion implantation is performed using the implantation mask formed such that a GR region 5 has no mask, a first JTE 6 has an aperture ratio of 75%, a second JTE 7 has an aperture ratio of 50%, and a third JTE 8 has an aperture ratio of 25%. In this manner, by forming the implantation mask having different aperture ratios for respective regions, a JTE breakdown voltage structure having a plurality of regions with different impurity concentrations can be formed in a single mask step and a single ion implantation step.

Figure 11A:
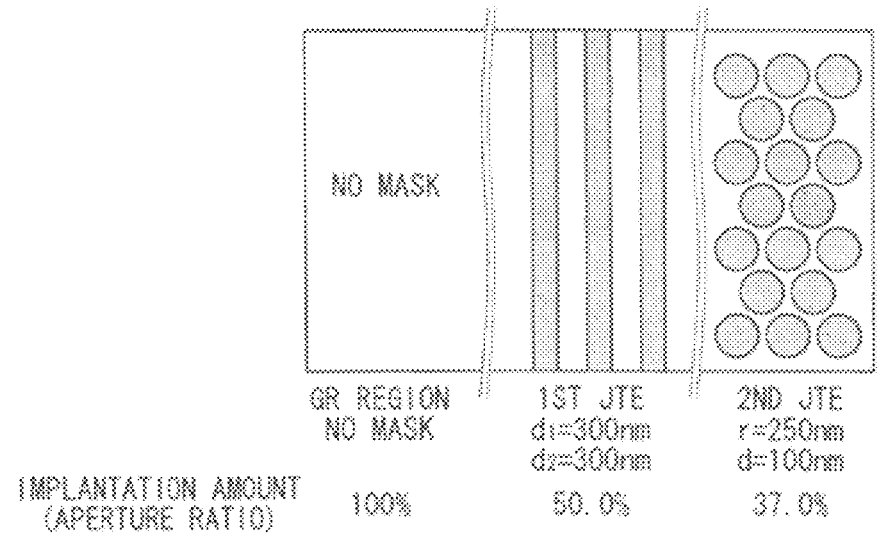
FIGS. 11A, 11B, and 11C are diagrams for explaining a formation of a Schottky diode having a JTE structure.
Figure 11B:
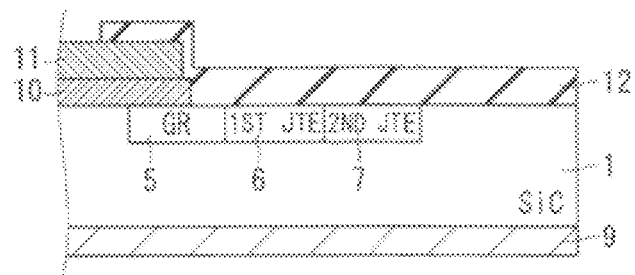
Figure 11C:
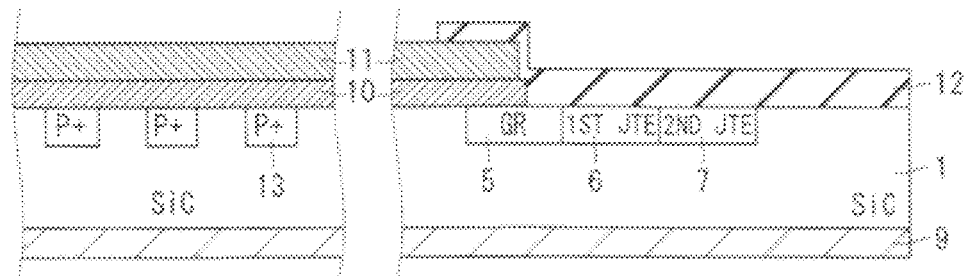

FIGS. 11A, 11B, and 11C show an example of forming a termination structure of a Schottky diode by using the implantation mask described in this preferred embodiment. As shown in FIG. 9, a GR region, a first JTE 6, and a second JTE 7 (any number of JTEs may be formed) having different impurity concentrations are formed in a silicon carbide semiconductor layer. To form the respective regions, as illustrated in FIG. 11A, no mask is formed in the GR region 5, stripe-shaped unit masks each having a stripe width of $d_1=300$ nm and a mask interval of $d_2=300$ nm are formed in the first JTE 6 (aperture ratio 50%), and circular unit masks each having a radius of r=250 nm and a mask interval of d=100 nm are formed in the second JTE 7 (aperture ratio 37%). Al ion is implanted using such an implantation mask, to form a JTE structure in the silicon carbide semiconductor layer.

Then, a Schottky electrode 10, a surface electrode 11, a back surface electrode 9, and a protective film 12 are formed, so that the Schottky diode shown in FIG. 11B is formed.

If the Schottky diode has an MPS structure or a JBS structure as shown in FIG. 11C, p-type regions 13 located below the Schottky electrode 10 can be formed simultaneously with the p-type regions (the GR 5, the first JTE 6, and the second JTE 7) (any number of JTEs may be formed) of the termination structure, in the same mask step and the same ion implantation step, to thereby simplify a manufacturing process. However, it is not always necessary to simultaneously form the p-type regions 13 located below the Schottky electrode 10 and the p-type regions 5 to 7 of the termination structure. The p-type regions 13 located below the Schottky electrode 10 and the p-type regions 5 to 7 of the termination structure may be formed by using separate masks. Alternatively, in another possible method, the p-type regions 13 located below the Schottky electrode 10 and the p-type regions 5 to 7 of the termination structure are formed by using the same mask, and then an additional ion implantation is performed only in the p-type regions 13 located below the Schottky electrode 10.

Alternatively, in still another possible method, the p-type regions 13 located below the Schottky electrode 10 and the p-type regions 5 to 7 of the termination structure are formed by using the same mask, and then an additional ion implantation is performed only in the p-type regions 5 to 7 of the termination structure. Adoption of these methods has an advantage of an increased degree of freedom in device designing, though the number of manufacturing steps is increased.

Next, FIG. 12 shows an example of manufacturing a MOSFET by using the implantation mask of this preferred embodiment. In a case of the MOSFET, a p-well 19 and the p-type regions (the GR 5, the first JTE 6, the second JTE 7, and the third JTE 8) (any number of JTEs may be formed) of the termination structure can be formed in a single ion implantation step by using the implantation mask of the preferred embodiment 1. Then, a back surface electrode 9, a gate oxide film 15, a polysilicon 16, an interlayer oxide film 17, a surface electrode 11, and a protective film 12 are formed. Thus, the MOSFET of FIG. 12 is prepared.

Figure 13:
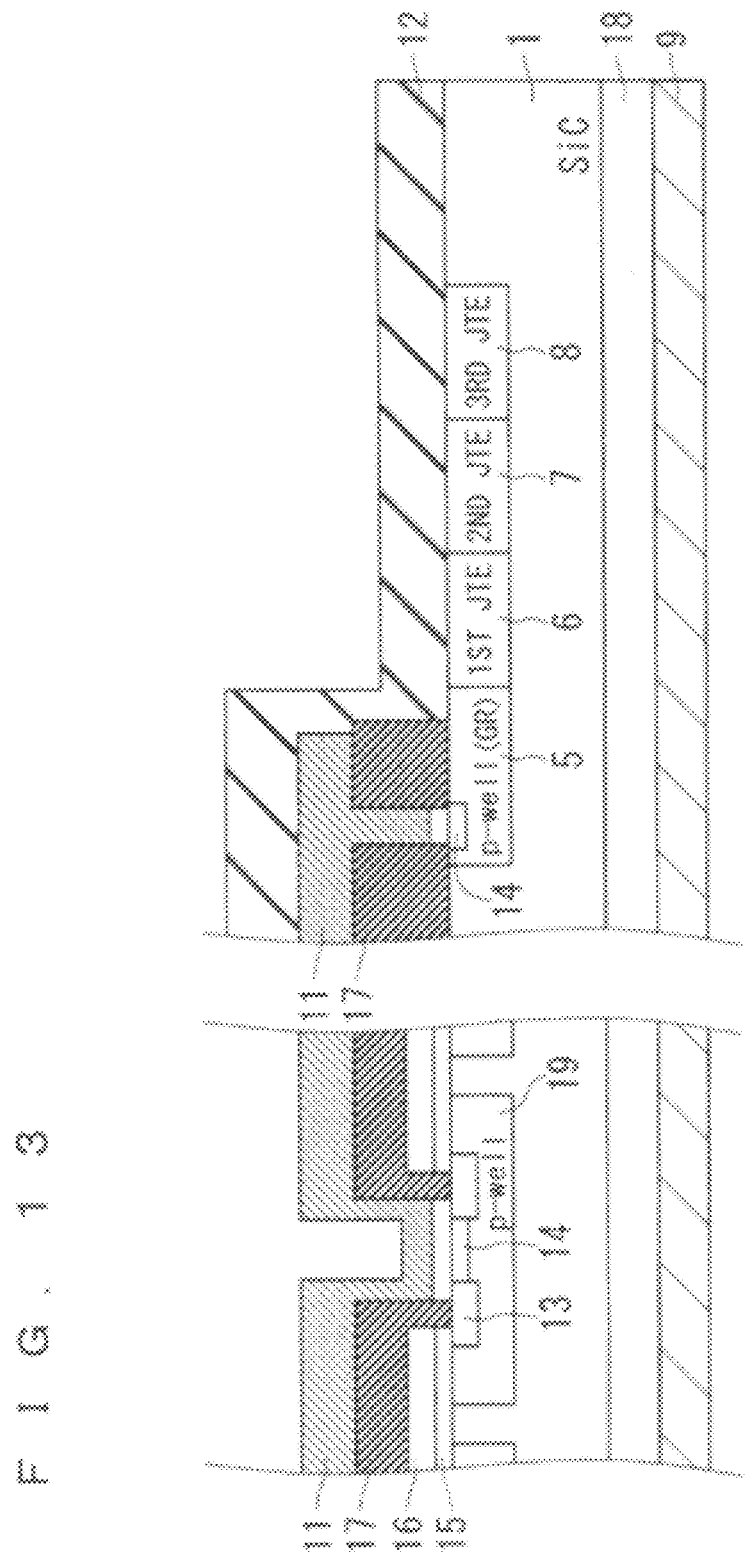
FIG. 13 is a cross-sectional view showing a structure of an IGBT.

FIG. 13 shows a structure of an IGBT. In a case of the IGBT, similarly to the MOSFET, a p-well 19 and the p-type regions (the GR 5, the first JTE 6, the second JTE 7, and the third JTE 8) (any number of JTEs may be formed) of the termination structure can be formed in a single ion implantation step by using the implantation mask of the preferred embodiment 1.

In the cases of the MOSFET and the IGBT, a deep Al implantation is required in order to obtain low channel resistance characteristics at a high breakdown voltage. Under the present circumstances, there is a problem that the deep Al implantation requires high energy which causes a small beam current and thus an ion implantation time period is long. Accordingly, instead of performing a high-energy Al implantation a plurality of times corresponding to the p-well 19 and the respective p-type regions of the termination structure, these regions are formed in a single Al implantation by using the implantation mask of the preferred embodiment 1. Thereby, the ion-implantation time period can be considerably shortened, and manufacturing costs can be suppressed.

In the cases of the MOSFET and the IGBT shown in FIGS. 12 and 13, it is not always necessary to simultaneously form the p-well 19 and the p-type regions 5 to 8 of the termination structure. The p-well 19 and the p-type regions 5 to 8 of the termination structure may be formed by using separate masks. Alternatively, in another possible method, the p-well 19 and the p-type regions 5 to 8 of the termination structure are formed by using the same mask, and then an additional ion implantation is performed only in the p-well 19. Alternatively, in still another possible method, the p-well 19 and the p-type regions 5 to 8 of the termination structure are formed by using the same mask, and then an additional ion implantation is performed only in the p-type regions 5 to 8 of the termination structure. Adoption of these methods has an advantage of an increased degree of freedom in device designing, though the number of manufacturing steps is increased.

EFFECT

The method of manufacturing the silicon carbide semiconductor device of the preferred embodiment 1 exerts the following effects. The method of manufacturing the silicon carbide semiconductor device of the preferred embodiment 1 includes the steps of (a) forming an implantation mask made up of a plurality of unit masks on a silicon carbide semiconductor layer, and (b) implanting predetermined ion in the silicon carbide semiconductor layer at a predetermined implantation energy by using the implantation mask. In the step (a), the implantation mask is formed such that a length from any point in the unit mask to an end of the unit mask can be equal to or less than a scattering length obtained when the predetermined ion is implanted in silicon carbide at a predetermined implantation energy and the implantation mask can have a plurality of regions different from each other in terms of the size and the arrangement interval of the unit masks. Thereby, in the silicon carbide semiconductor layer causing substantially no thermal diffusion, a plurality of regions having different impurity concentrations can be formed in a single mask step and a single ion implantation step.

A length from any point in the unit mask to an end of the unit mask is set at 250 nm or less, and Al ion is implanted in the implantation mask at 700 keV or more. As shown in FIG. 1, Al ion in silicon carbide is scattered in the direction perpendicular to the implantation direction by 250 nm or more. Therefore, by performing the ion implantation under the above-described conditions, the impurity region can be formed immediately below each unit mask.

The implantation mask can be formed with stripe-shaped unit masks. The impurity concentration can be controlled by adjusting a stripe width and a mask interval.

Alternatively, the implantation mask may be formed with circular unit masks. In this case, the impurity concentration can be controlled by adjusting a radius and a mask interval.

Alternatively, the implantation mask may be formed with rectangular unit masks. In this case, the impurity concentration can be controlled by adjusting side lengths of the rectangular shape and a mask interval.

Alternatively, the implantation mask may be formed with crisscross unit masks. In this case, the impurity concentration can be controlled by adjusting the size of the unit mask and a mask interval.

In a silicon carbide semiconductor device having a JTE structure at a terminal portion thereof, such as a Schottky diode, a plurality of regions having different impurity concentrations which form the JTE structure may be formed by any one of the above-described methods of manufacturing the silicon carbide semiconductor device. This can reduce the number of mask steps and ion implantation steps, so that costs involved in the manufacturing process can be suppressed.

Furthermore, the silicon carbide semiconductor device is a Schottky diode having a JBS structure or an MPS structure. If a Schottky diode having a JBS structure or an MPS structure is manufactured by using the implantation mask of this preferred embodiment, the p-type region 13 located below the Schottky electrode 10 and the JTE structures 5 to 7 can be simultaneously formed, which can reduce the number of manufacturing steps.

Alternatively, the silicon carbide semiconductor device is a MOSFET. In a MOSFET manufacturing process, the JTE regions 5 to 8 of the termination structure can be formed in a single implantation step. Moreover, the p-well 19 and the JTE regions 5 to 8 of the termination structure can be formed in the same implantation step, which can reduce the number of times high-energy Al is implanted.

Alternatively, the silicon carbide semiconductor device is an IGBT. In an IGBT manufacturing process, the JTE regions 5 to 8 of the termination structure can be formed in a single implantation step. Moreover, the p-well 19 and the JTE regions 5 to 8 of the termination structure can be formed in the same implantation step, which can reduce the number of times high-energy Al is implanted.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a silicon carbide semiconductor device, comprising:
   selecting plural unit mask sizes based on a scattering length of ions to be implanted in a silicon carbide semiconductor layer at an implantation energy;
   forming an implantation mask made of a plurality of unit masks of the plural unit mask sizes on the silicon carbide semiconductor layer; and
   implanting the ions in said silicon carbide semiconductor layer at the implantation energy by using said implantation mask,
   wherein, in said selecting, the plural unit mask sizes are selected such that a length from any point in each unit mask to an end of said unit mask is equal to or less than the scattering length of the ions implanted in the silicon carbide semiconductor layer at said implantation energy and said implantation mask has a plurality of regions different from each other in terms of a size of said unit masks and an arrangement interval of said unit masks.

2. The method of manufacturing a silicon carbide semiconductor device according to claim 1, wherein
   in said selecting, the length from any point in each unit mask to the end of said unit mask is equal to or less than 250 nm,
   in said implanting, Al ions are implanted toward said implantation mask at 700 keV or more.

3. The method of manufacturing a silicon carbide semiconductor device according to claim 2, wherein
   said implantation mask formed in said forming is made up of stripe-shaped unit masks.

4. The method of manufacturing a silicon carbide semiconductor device according to claim 2, wherein
   said implantation mask formed in said forming is made up of circular unit masks.

5. The method of manufacturing a silicon carbide semiconductor device according to claim 2, wherein
   said implantation mask formed in said forming is made up of rectangular unit masks.

6. The method of manufacturing a silicon carbide semiconductor device according to claim 2, wherein
   said implantation mask formed in said forming is made up of crisscross unit masks.

7. A method of manufacturing a silicon carbide semiconductor device having a JTE structure at a terminal portion thereof, wherein
   a plurality of regions having different impurity concentrations which form said JTE structure are formed by the method of manufacturing a silicon carbide semiconductor device according to claim 2.

8. The method of manufacturing a silicon carbide semiconductor device according to claim 7, wherein
   said silicon carbide semiconductor device is a Schottky diode.

9. The method of manufacturing a silicon carbide semiconductor device according to claim 8, wherein
   said silicon carbide semiconductor device is a Schottky diode having a JBS structure or an MPS structure.

10. The method of manufacturing a silicon carbide semiconductor device according to claim 7, wherein
    said silicon carbide semiconductor device is a MOSFET.

11. The method of manufacturing a silicon carbide semiconductor device according to claim 7, wherein
    said silicon carbide semiconductor device is an IGBT.

12. The method of manufacturing a silicon carbide semiconductor device according to claim 7, wherein
    the size and arrangement of unit masks in each region of the implantation mask is based on a distance of a region of the JTE structure corresponding to the respective region of the implantation mask from an electrode of the silicon carbide semiconductor device.

* * * * *